United States Patent
Chen et al.

(10) Patent No.: US 12,212,075 B2
(45) Date of Patent: Jan. 28, 2025

(54) ELECTRONIC DEVICE

(71) Applicant: Innolux Corporation, Miao-Li County (TW)

(72) Inventors: Ying-Jen Chen, Miao-Li County (TW); Chih-Yung Hsieh, Miao-Li County (TW); Yan-Zheng Wu, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 334 days.

(21) Appl. No.: 17/748,057

(22) Filed: May 19, 2022

(65) Prior Publication Data

US 2022/0393346 A1 Dec. 8, 2022

Related U.S. Application Data

(60) Provisional application No. 63/196,706, filed on Jun. 4, 2021.

(30) Foreign Application Priority Data

Oct. 26, 2021 (CN) .......................... 202111249366.9

(51) Int. Cl.
*H01Q 3/34* (2006.01)
*H01Q 1/22* (2006.01)

(52) U.S. Cl.
CPC ............. *H01Q 3/34* (2013.01); *H01Q 1/2283* (2013.01)

(58) Field of Classification Search
CPC ................................ H01Q 3/34; H01Q 1/2283
(Continued)

(56) References Cited

U.S. PATENT DOCUMENTS

| 6,417,807 B1 * | 7/2002 | Hsu ...................... H01Q 9/285 343/781 CA |
| 8,674,885 B2 | 3/2014 | Leiba et al. |

(Continued)

FOREIGN PATENT DOCUMENTS

| CA | 3088497 A1 * | 7/2019 |
| WO | WO-2018115896 A2 * | 6/2018 |

OTHER PUBLICATIONS

"Office Action of Taiwan Counterpart Application", issued on Sep. 12, 2022, p. 1-p. 7.
(Continued)

*Primary Examiner* — Harry K Liu
(74) *Attorney, Agent, or Firm* — JCIPRNET

(57) ABSTRACT

The disclosure provides an electronic device. The electronic device includes a plurality of units. Each of the units includes an integrated substrate. The integrated substrate includes a first dielectric layer, a first conductive layer, a second dielectric layer, and a second conductive layer. The first dielectric layer has a first side and a second side opposite to the first side. The first conductive layer is disposed on the first side. The second dielectric layer has a third side facing the second side and a fourth side opposite to the third side. The second conductive layer is disposed on the fourth side. A loss tangent of at least one of the first dielectric layer and the second dielectric layer is less than or equal to 0.1 and greater than 0. The electronic device of an embodiment of the disclosure may improve product yield.

16 Claims, 10 Drawing Sheets

(58) Field of Classification Search
USPC .......................................................... 342/368
See application file for complete search history.

(56) References Cited

U.S. PATENT DOCUMENTS

| | | |
|---|---|---|
| 8,848,389 B2 | 9/2014 | Kawamura et al. |
| 2004/0262645 A1 | 12/2004 | Huff et al. |
| 2007/0023888 A1 | 2/2007 | Fujii |
| 2018/0247905 A1 | 8/2018 | Yu et al. |
| 2019/0393606 A1 | 12/2019 | Chavali et al. |
| 2020/0035625 A1 | 1/2020 | Wang et al. |
| 2021/0007224 A1* | 1/2021 | Orlowski ............... H05K 1/113 |

OTHER PUBLICATIONS

"Search Report of Europe Counterpart Application", issued on Nov. 9, 2022, p. 1-p. 10.

* cited by examiner

ELECTRONIC DEVICE

CROSS-REFERENCE TO RELATED APPLICATION

This application claims the priority benefit of U.S. provisional application Ser. No. 63/196,706, filed on Jun. 4, 2021, and China application serial no. 202111249366.9, filed on Oct. 26, 2021. The entirety of each of the above-mentioned patent applications is hereby incorporated by reference herein and made a part of this specification.

BACKGROUND

Technical Field

The disclosure relates to an electronic device, and more particularly, to an electronic device capable of improving product yield.

Description of Related Art

Electronic devices or tiling electronic devices have been widely used in mobile phones, televisions, monitors, tablet computers, car displays, wearable devices, and desktop computers. With the vigorous development of electronic devices, the quality requirements for electronic devices is becoming higher, and such electronic products may usually be used as electronic modulation devices at the same time, such as antenna devices that may modulate electromagnetic waves. However, the existing antenna devices still fail not meet the needs of consumers in every aspect.

SUMMARY

The disclosure provides an electronic device that may improve product yield.

According to an embodiment of the disclosure, an electronic device includes a plurality of units, and each of the units includes an integrated substrate. The integrated substrate includes a first dielectric layer, a first conductive layer, a second dielectric layer, and a second conductive layer. The first dielectric layer has a first side and a second side opposite to the first side. The first conductive layer is disposed on the first side. The second dielectric layer has a third side facing the second side and a fourth side opposite to the third side. The second conductive layer is disposed on the fourth side. A loss tangent of at least one of the first dielectric layer and the second dielectric layer is less than or equal to 0.1 and greater than 0.

According to an embodiment of the disclosure, an electronic device includes a plurality of conductive structures. Each of the conductive structures includes a third dielectric layer, a through hole, a third conductive layer, an opening, and a fourth conductive layer. The through hole is disposed in the third dielectric layer. The third conductive layer is disposed on the third dielectric layer. The opening is disposed in the third conductive layer. The fourth conductive layer is disposed on the third conductive layer. The fourth conductive layer is directly in contact with a top surface of the third conductive layer and passes through the opening.

BRIEF DESCRIPTION OF THE DRAWINGS

The accompanying drawings are included to further understand the disclosure, and the drawings are incorporated in the specification and constitute a part of the specification. The drawings illustrate embodiments of the disclosure and, together with the description, serve to explain principles of the disclosure.

DESCRIPTION OF THE EMBODIMENTS

Figure 1:
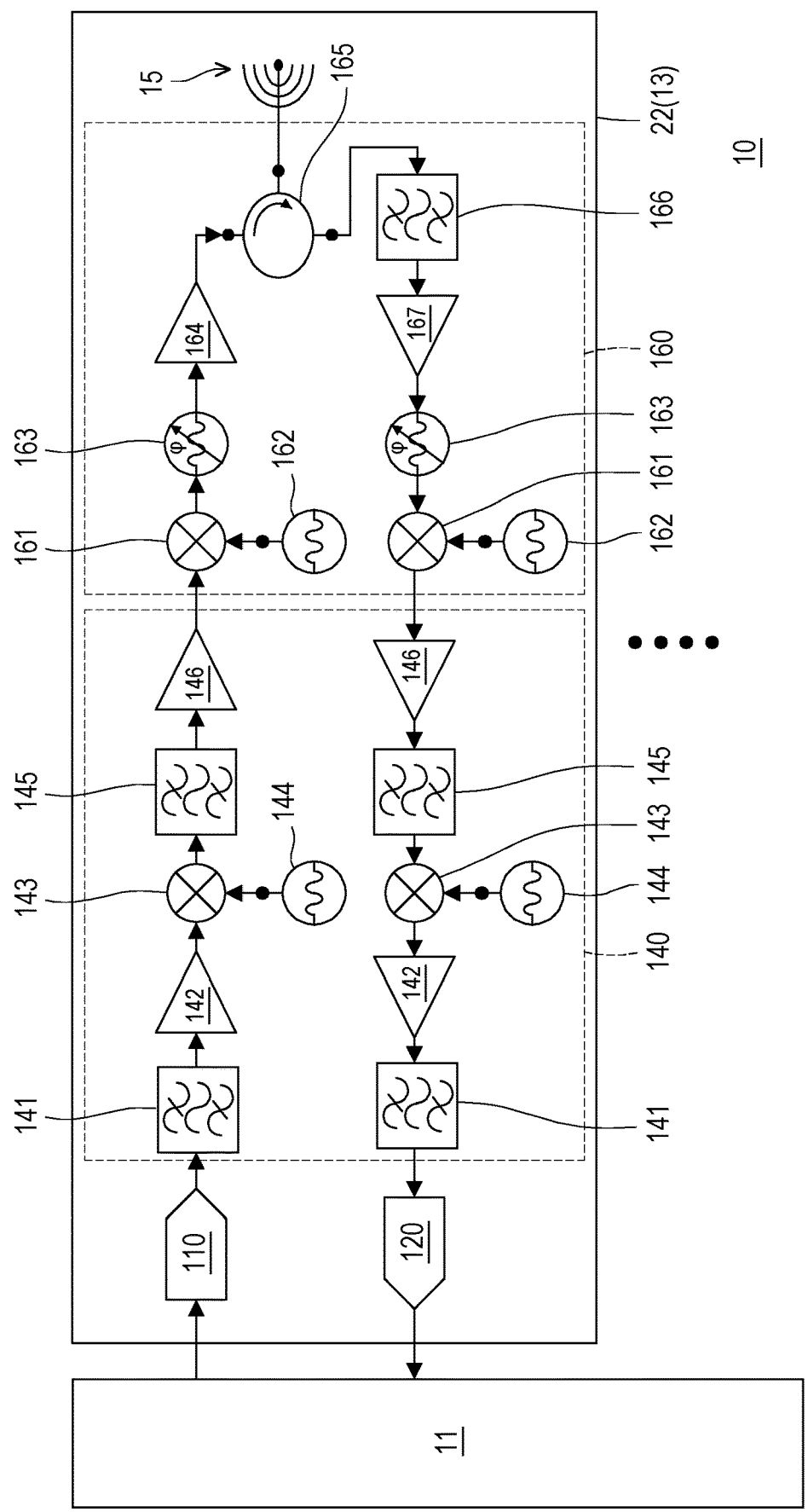
FIG. 1 is a functional view of an electronic device of an embodiment of the disclosure.

The disclosure may be understood by referring to the following detailed description in conjunction with the accompanying drawings. It should be noted that in order to facilitate understanding to the reader and to simplify the drawings, the multiple drawings in the disclosure depict a part of the electronic device, and certain elements in the drawings are not drawn to actual scale. In addition, the number and size of each element in the figures are for illustration, and are not intended to limit the scope of the disclosure.

In the following description and claims, the words "including" and "containing" and the like are open words, so they should be interpreted as meaning "including but not limited to . . . ."

It should be understood that when an element or film layer is referred to as "on" or "connected to" to another element or film layer, the element or film layer may be directly on the other element or film layer or directly connected to the other element or layer, or there is an intervening element or film layer between the two (indirect case). Conversely, when an element is referred to as "directly" on or "directly connected" to another element or film layer, there is no intervening element or film layer between the two.

Although the terms "first", "second", "third" . . . may be used to describe various constituent elements, the constituent elements are not limited to these terms. These terms are used to distinguish a single constituent element from other constituent elements in the specification. The same terms may be omitted in the claims, and the elements in the claims may be replaced with first, second, third . . . according to the order declared by the elements in the claims. Therefore, in the following description, the first constituent element may be the second constituent element in the claims.

In the text, the terms "about", "approximately", "substantially", "essentially" generally mean within 10%, or within 5%, or within 3%, or within 2%, or within 1%, or within 0.5% of a given value or range. Quantities given herein are approximate quantities, that is, in the absence of a specific description of "about", "approximately", "substantially", "essentially", the meanings of "about", "approximately", "substantially", "essentially" may still be implied.

In the disclosure, the length, width, thickness, height or area, or distance or pitch between elements may be measured using optical microscopy (OM), scanning electron microscope (SEM), film thickness profiler (α-step), ellipse thickness gauge, or other suitable methods. In detail, according to some embodiments, a cross-sectional structure image including the element to be measured may be obtained, and the width, thickness, height or area of each element, or the distance or pitch between elements may be measured using SEM, but the disclosure is not limited thereto.

In some embodiments of the disclosure, terms such as "connection", "interconnection", etc., regarding bonding and connection, unless specifically defined, may mean that two structures are in direct contact, or that two structures are not in direct contact and there are other structures located between these two structures. Moreover, the terms of bonding and connection may also include the case where both structures are movable or both structures are fixed. In addition, the term "coupled" includes any direct and indirect electrical connection means.

An electronic device of the disclosure may include a display device, a backlight device, an antenna device, a sensing device, or a tiling device, but the disclosure is not limited thereto. The electronic device may be a bendable or flexible electronic device. The display device may be a non-self-luminous type display device or a self-luminous type display device. The antenna device may be a liquid-crystal type antenna device or a non-liquid-crystal type antenna device, and the sensing device may be a sensing device sensing capacitance, light, heat, or ultrasound, but the disclosure is not limited thereto. The electronic element may include a passive element and an active element, such as a capacitor, a resistor, an inductor, a diode, a transistor, and so on. The diode may include a light-emitting diode or a photodiode. The light-emitting diode may include, for example, an organic light-emitting diode (OLED), a mini LED, a micro LED, or a quantum dot LED, but the disclosure is not limited thereto. The tiling device may be, for example, a display tiling device or an antenna tiling device, but the disclosure is not limited thereto. It should be noted that the electronic device may be any combination of the above, but the disclosure is not limited thereto. The following uses an antenna device as an electronic device or a tiling device to explain the content of the disclosure, but the disclosure is not limited thereto.

It should be noted that in the following embodiments, the features in several different embodiments may be replaced, recombined, and mixed to complete other embodiments without departing from the spirit of the disclosure. As long as the features between the embodiments do not violate the spirit of the disclosure or conflict with each other, they may be mixed and used arbitrarily.

Hereinafter, reference will be made in detail to exemplary embodiments of the disclosure, and examples of the exemplary embodiments are illustrated in the figures. Wherever possible, the same reference numerals are used in the figures and the descriptions to refer to the same or similar portions.

FIG. 1 is a functional view of an electronic device of an embodiment of the disclosure. Referring to FIG. 1, an electronic device 10 of the present embodiment may be regarded as an antenna device, including a baseband circuit 11 and a phased array antenna 13.

Specifically, in the present embodiment, the phased array antenna 13 may, for example, adopt an analog beam-forming technique, but the disclosure is not limited thereto. In particular, the phased array antenna 13 may include a plurality of units 22 (one antenna is schematically taken as an example in FIG. 1), and the plurality of units 22 are arranged in an array (not shown). Each of the units 22 includes a digital-to-analog converter 110, an analog-to-digital converter 120, an intermediate frequency (IF) circuit 140, a radio frequency (RF) circuit 160, and an antenna element 15. The IF circuit 140 includes a filter 141, an amplifier 142, a mixer 143, a local oscillator 144, a filter 145, and an amplifier 146. The RF circuit 160 includes a mixer 161, a local oscillator 162, a phase shifter 163, a power amplifier 164, a diplexer 165, a filter 166, and a low-noise amplifier 167.

In the present embodiment, when the electronic device 10 transmits a signal, the baseband circuit 11 may first convert the low-frequency digital signal into a low-frequency analog signal and transmit the low-frequency analog signal to the IF circuit 140 via the digital-to-analog converter 110 in the units 22; next, via the filter 141, the amplifier 142, the mixer 143, the local oscillator 144, the filter 145, and the amplifier 146 in the IF circuit 140, the low-frequency analog signal is converted into an IF analog signal and transmitted to the RF circuit 160; next, via the mixer 161, the local oscillator 162, the phase shifter 163, the power amplifier 164, and the diplexer 165 in the RF circuit 160, the IF analog signal is converted into a high-frequency analog signal and transmitted to the antenna element 15; then, the high-frequency analog signal (i.e., electromagnetic wave) is emitted to the outside via the antenna element 15.

In contrast, when the electronic device 10 receives a signal, first, using the antenna element 15, the electromagnetic wave from the outside is received and transmitted to the RF circuit 160 in the units 22; next, via the RF circuit 160, the high-frequency analog signal is converted into an IF analog signal and transmitted to the IF circuit 140; next, via the IF circuit 140, the IF analog signal is converted into a low-frequency analog signal and transmitted to the analog-to-digital converter 120; then, via the analog-to-digital converter 120, the low-frequency analog signal is converted into a low-frequency digital signal and transmitted to the baseband circuit 11.

In some embodiments, the phased array antenna may also adopt a digital beam-forming technique (not shown). In this case, each of the units in the phased array antenna may then include a digital-to-analog converter, an analog-to-digital converter, a power amplifier, a diplexer, a filter, and a low-noise amplifier.

Figure 2A:
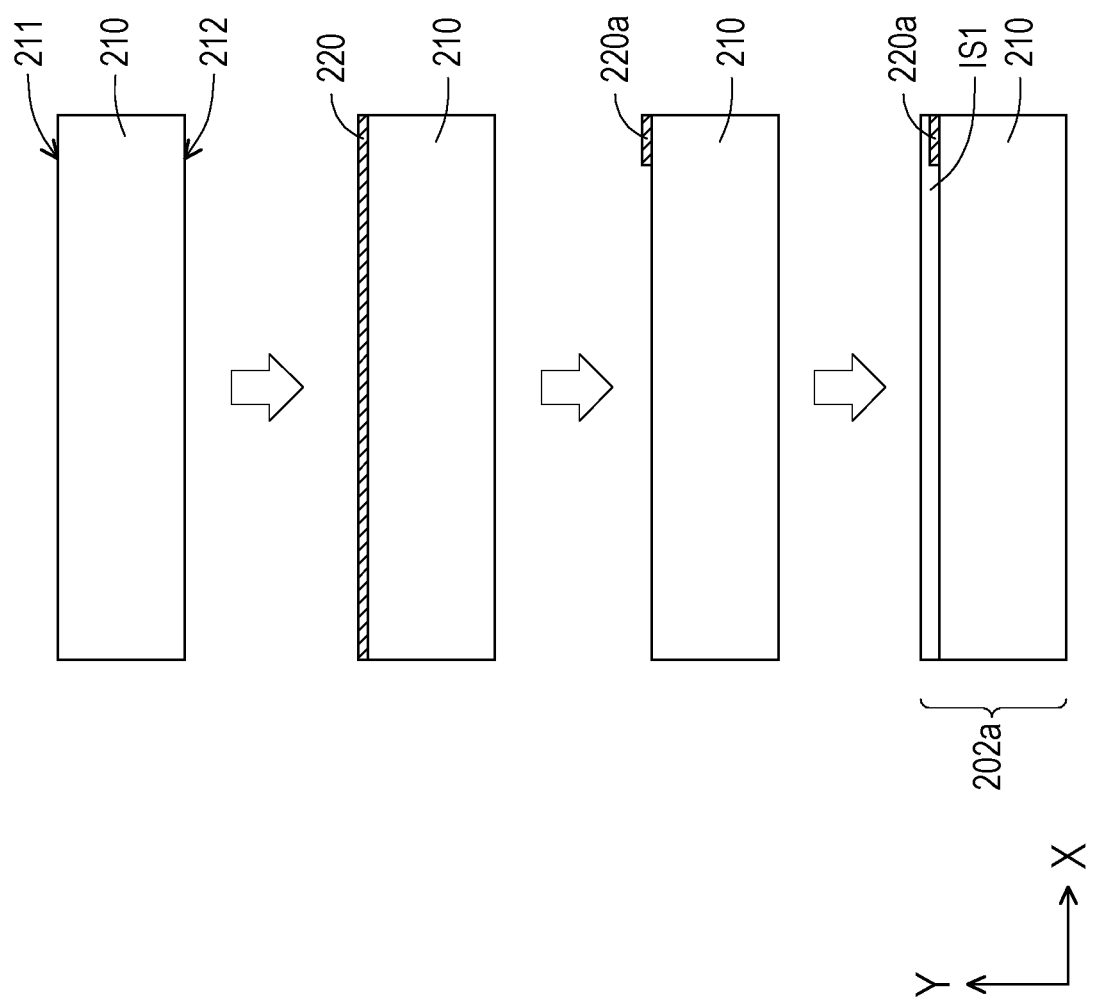
FIG. 2A to FIG. 2F are schematic cross-sectional views of a manufacturing method of an electronic device of an embodiment of the disclosure.
Figure 2B:
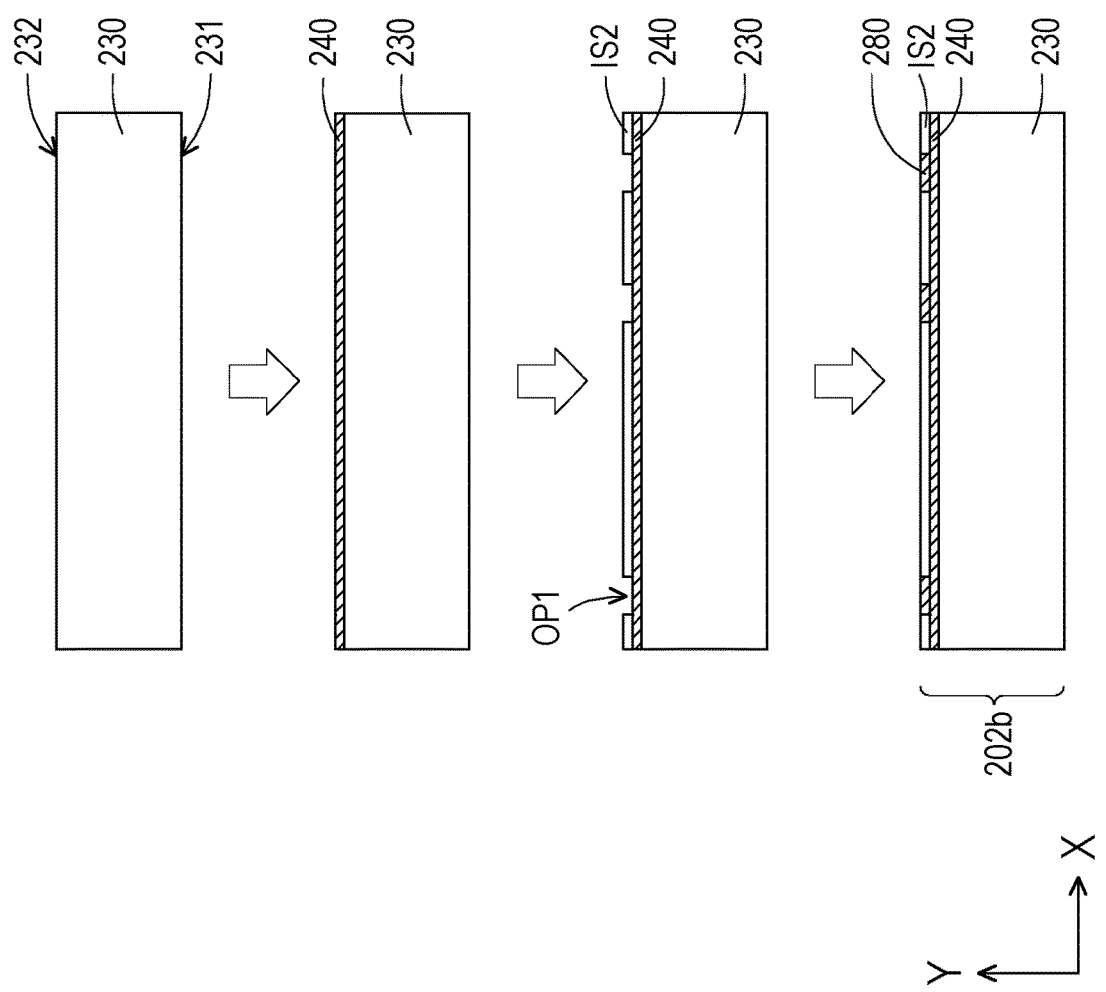
Figure 2C:
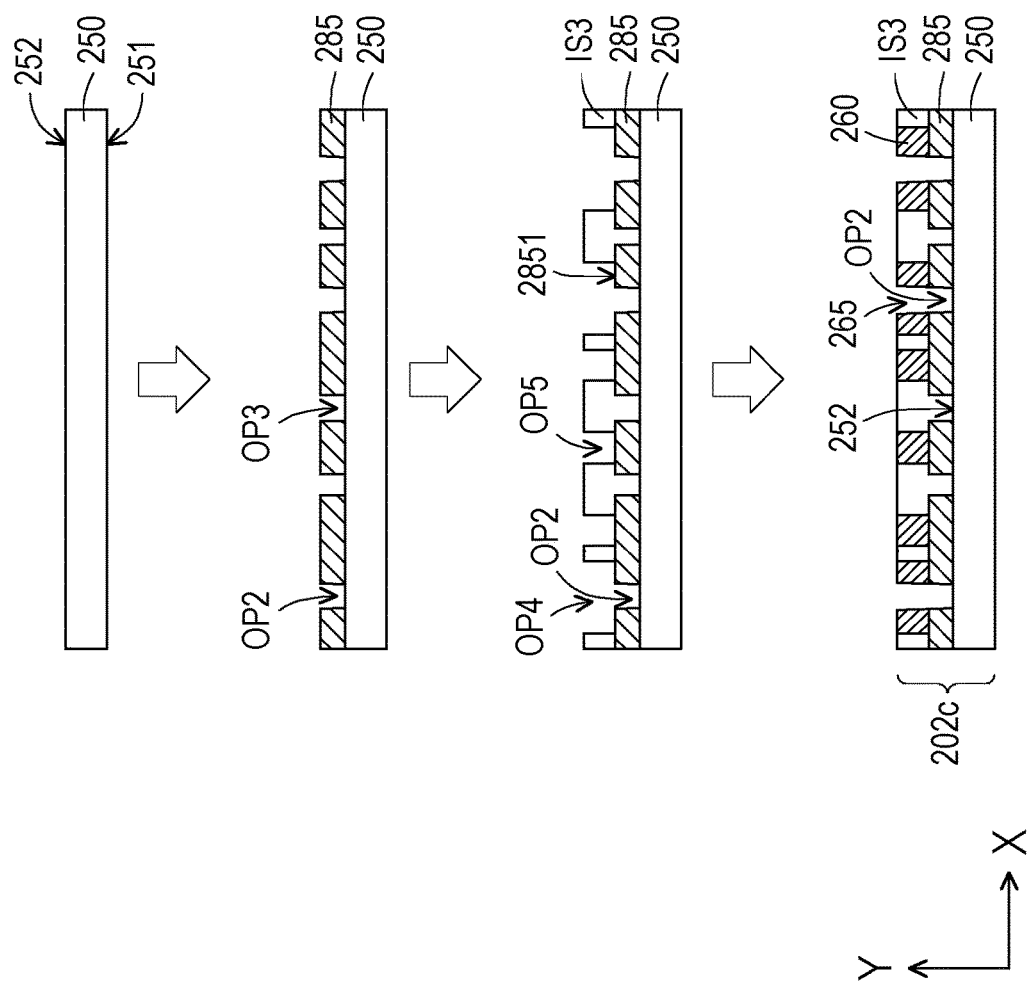
Figure 2D:
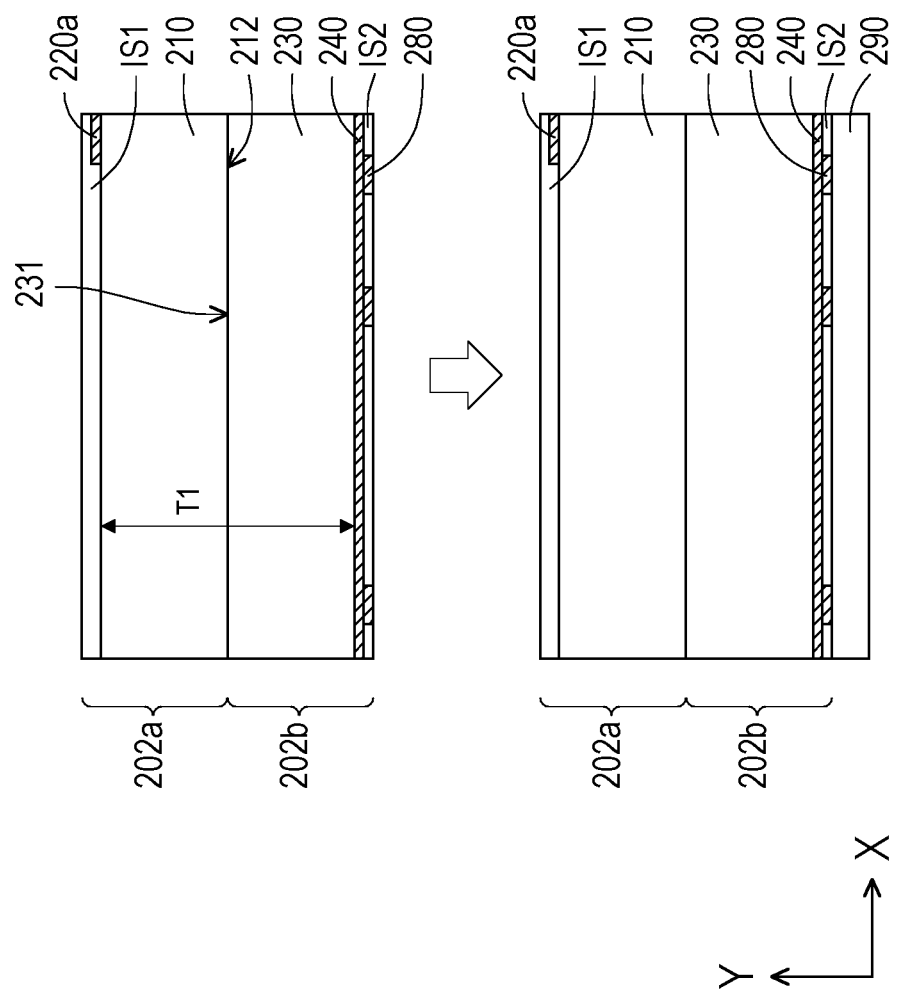
Figure 2E:
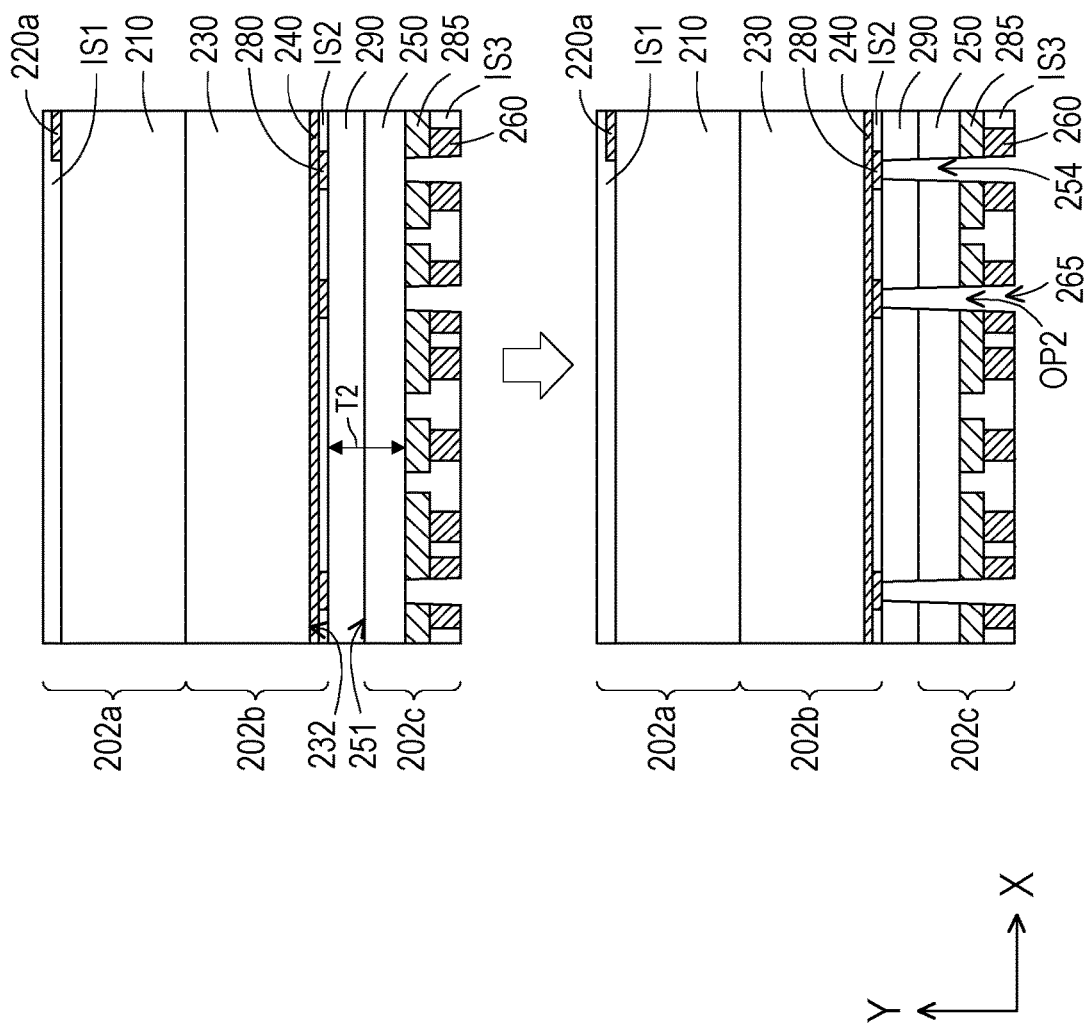
Figure 2F:
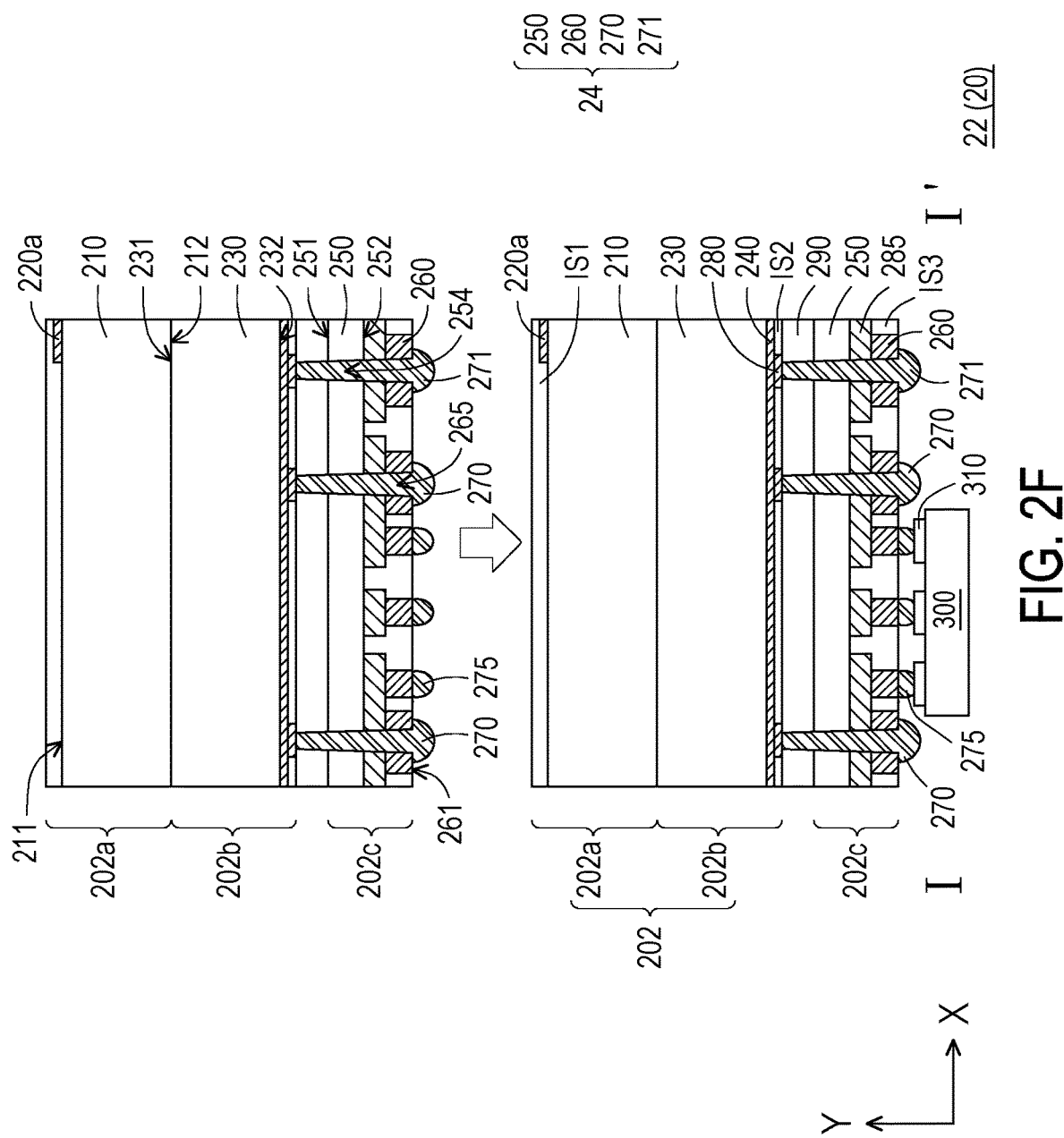
Figure 3:
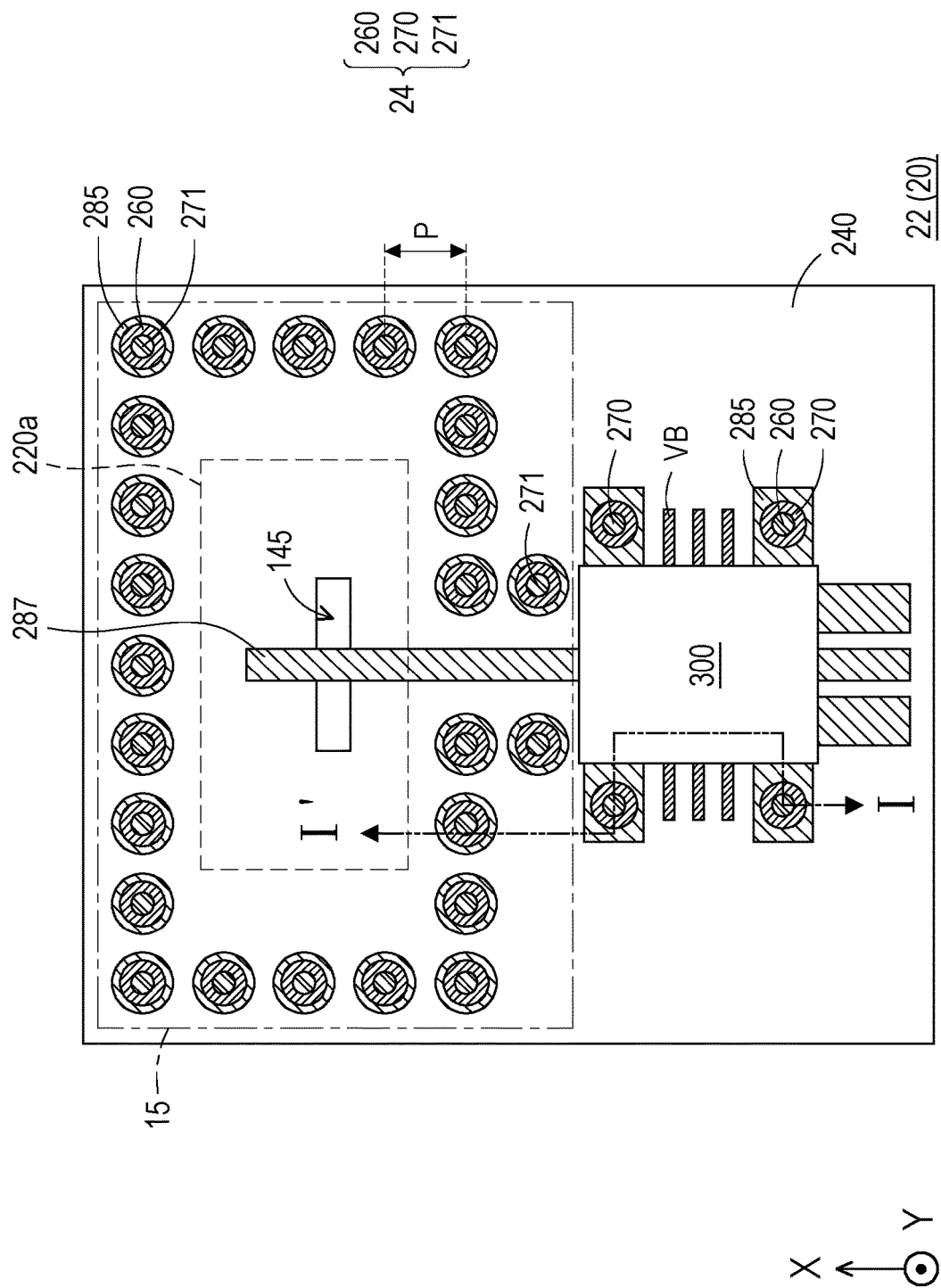
FIG. 3 is a schematic top view of the electronic device of FIG. 2F.

FIG. 2A to FIG. 2F are schematic cross-sectional views of a manufacturing method of an electronic device of an embodiment of the disclosure. FIG. 3 is a schematic top view of the electronic device of FIG. 2F. FIG. 2F is a schematic cross-sectional view of the electronic device of FIG. 3 along section line I-I'. For the clarity of the drawings and the convenience of description, FIG. 3 omits to show some elements in an electronic device 20.

Please refer to FIG. 2F and FIG. 3 first, the electronic device 20 of the present embodiment includes the plurality of units 22 (one unit is schematically used as an example in FIG. 2F), and the units 22 include a conductive structure 24 (one conductive structure is schematically used as an example in FIG. 2F) and a chip 300. Specifically, each of the units 22 includes an integrated substrate 202. The integrated substrate 202 includes a first dielectric layer 210, a first conductive layer 220a, a second dielectric layer 230, and a second conductive layer 240. The first dielectric layer 210 has a first side 211 and a second side 212 opposite to the first side 211. The first conductive layer 220a is disposed on the first side 211. The second dielectric layer 230 has a third side 231 facing the second side 212 and a fourth side 232 opposite to the third side 231. The second conductive layer 240 is disposed on the fourth side 232. Since a loss tangent Df of at least one of the first dielectric layer 210 and the second dielectric layer 230 is less than or equal to 0.1 and greater than 0 (i.e., $0<Df\leq0.1$), the loss of the electromagnetic wave in the first dielectric layer 210 and the second dielectric layer 230 may be reduced, and thus the emission efficiency of the electromagnetic wave may be improved.

Moreover, each of the conductive structures 24 includes a third dielectric layer 250, a through hole 254, a third conductive layer 260, an opening 265, and fourth conductive layers 270 and 271. The third dielectric layer 250 has a fifth side 251 facing the fourth side 232 and a sixth side 252 opposite to the fifth side 251. The through hole 254 is disposed in the third dielectric layer 250. The third conductive layer 260 is disposed on the third dielectric layer 250 and disposed on the sixth side 252. The opening 265 is disposed in the third conductive layer 260. The fourth conductive layers 270 and 271 are disposed on the third conductive layer 260. The fourth conductive layers 270 and 271 are directly in contact with a top surface 261 of the third conductive layer 260 and passes through the opening 265. In particular, a plurality of fourth conductive layers 270 may surround the chip 300 and may be used to transmit a ground signal to the second conductive layer 240. In other embodiments, the plurality of fourth conductive layers 270 may not surround the chip 300.

In the present embodiment, each of the conductive structures 24 further includes a conductor 280, a bottom conductive layer 285, and a fourth dielectric layer 290. The conductor 280 is disposed on the fourth dielectric layer 290. The conductor 280 is electrically connected to the fourth conductive layers 270 and 271. The bottom conductive layer 285 is disposed between the third dielectric layer 250 and the third conductive layer 260. The bottom conductive layer 285 may be directly in contact with the third conductive layer 260. The fourth dielectric layer 290 is combined with the third dielectric layer 250.

In the present embodiment, a direction X and a normal direction Y of the electronic device 20 are different directions. The direction X is perpendicular to the normal direction Y, and the direction X is substantially the extending direction of section line I-I', but the disclosure is not limited thereto.

Moreover, in the present embodiment, in the normal direction Y of the electronic device 20, the shape of the third conductive layer 260 may correspond to the shape of the fourth conductive layers 270 and 271, the shape of the third conductive layer 260 may be a closed ring shape or a notched ring shape, and the shape of the fourth conductive layers 270 and 271 may be a solid figure. For example, as shown in FIG. 3, in the top view of the electronic device 20, the outer contour of the third conductive layer 260 is, for example, a circle, and the outer contours of the fourth conductive layer 270 and the fourth conductive layer 271 are also correspondingly a circle, but the disclosure is not limited thereto. In the present embodiment, the shape of the third conductive layer 260 (or the shape of the bottom conductive layer 285) may limit the shape and range of the fourth conductive layers 270 and 271, so that the fourth conductive layers 270 and 271 may be limited within the range of the shape of the third conductive layer 260 (or within the range of the shape of the bottom conductive layer 285) during manufacture, in order to alleviate the issue that the fourth conductive layers 270 and 271 overflow beyond the range of the shape of the third conductive layer 260 (or the range of the shape of the bottom conductive layer 285) during manufacture. In the present embodiment, the shape of the fourth conductive layer 270 may be substantially the same as the shape of the fourth conductive layer 271, but the disclosure is not limited thereto. In some embodiments, the shape of the fourth conductive layer 270 may also be different from the shape of the fourth conductive layer 271, as shown in FIG. 5A to FIG. 5D.

Referring to FIG. 3 again, the second conductive layer 240 has a slot 145, and the slot 145 may be disposed corresponding to the first conductive layer 220a. A plurality of fourth conductive layers 271 may surround the slot 145 and the antenna element 15 to prevent electromagnetic interference (EMI) and ensure the quality of the signal output from the chip 300. In particular, the electromagnetic interference is, for example, an electromagnetic wave leaked from other traces. In the present embodiment, the plurality of fourth conductive layers 271 are separated from each other, and there is a pitch P between two adjacent fourth conductive layers 271. In particular, the pitch P is the distance from the center of one of the fourth conductive layers 271 to the center of another adjacent fourth conductive layer 271. In the present embodiment, the pitch P may be, for example, less than half of a wavelength W1 of the electromagnetic wave transmitted between the bottom conductive layer 285 and the second conductive layer 240, that is, $P < \frac{1}{2} \times W1$, but the disclosure is not limited thereto.

The electronic device 20 of the present embodiment further includes a voltage bias trace VB and a conductive layer 287. The voltage bias trace VB may be configured as a signal line of an RF circuit, a signal line of an IF circuit, a power supply line, or a high-speed digital signal line. The voltage bias trace VB may be a single-layer or multi-layer structure, and the material thereof may, for example, include copper, silver, gold, aluminum, tin, alloy (e.g., electroless nickel-gold (ENIG)), or a combination of the above, but the disclosure is not limited thereto. The conductive layer 287 may transmit a signal (e.g., a high-frequency signal) output from the chip 300 to the slot 145, and then couple the signal to the first conductive layer 220a.

In the present embodiment, one chip 300 may correspond to one antenna element 15, but the disclosure is not limited thereto. In some embodiments, one chip 300 may also correspond to a plurality of antenna elements 15 (not shown). Moreover, in the present embodiment, the chip 300 is not disposed corresponding to the first conductive layer 220a, and the chip 300 is not overlapped with the first conductive layer 220a in the normal direction Y of the electronic device 20, but the disclosure is not limited thereto. In some embodiments, the chip may also be disposed corresponding to the first conductive layer (not shown), and the chip may also be overlapped with the first conductive layer (not shown) in the normal direction of the electronic device.

Referring to FIG. 2A to FIG. 2F, the following describes the manufacturing method of the electronic device 20 of the present embodiment. In particular, the manufacturing method of the electronic device 20 of the present embodiment takes one of the units 22 as an example, which may include, but is not limited to, the following steps:

First, referring to FIG. 2A, a first component 202a is formed. Specifically, forming the first component 202a may include, for example, the following steps: forming the first dielectric layer 210, wherein the first dielectric layer 210 has the first side 211 and the second side 212 opposite to the first side 211. The material of the first dielectric layer 210 may be, for example, glass, printed circuit board (PCB), low-temperature co-fired ceramic (LTCC), liquid-crystal polymer (LCP), polyimide (PI), ceramic, plastic film (e.g., cyclo olefin polymer (COP), polyethylene naphthalate (PEN)), other suitable dielectric materials, or a combination of the above, but the disclosure is not limited thereto. Next, the first conductive layer 220 is formed on the first side 211, and the first conductive layer 220 is patterned to expose a portion of the first dielectric layer 210, and the patterned first conductive layer 220a is formed. Next, a first insulating layer IS1 is formed on the first conductive layer 220a to cover the first conductive layer 220a and the portion of the first dielectric layer 210 exposed by the first conductive layer 220a. At this point, the manufacture of the first component 202a is complete.

Next, referring to FIG. 2B, a second component 202b is formed. Specifically, forming the second component 202b may include, for example, the following steps: forming the second dielectric layer 230, wherein the second dielectric layer 230 has the third side 231 and the fourth side 232 opposite to the third side 231. The material of the second dielectric layer 230 may be, for example, glass, printed circuit board (PCB), low-temperature co-fired ceramic (LTCC), liquid-crystal polymer (LCP), polyimide (PI), ceramic, plastic film (e.g., cyclo olefin polymer (COP), polyethylene naphthalate (PEN)), other suitable dielectric materials, or a combination of the above, but the disclosure is not limited thereto. The materials of the first dielectric layer and the second dielectric layer may be the same or different. Next, the second conductive layer 240 is formed on the fourth side 232, and a patterned second insulating layer IS2 is formed on the second conductive layer 240. The second insulating layer IS2 has an opening OP1 to expose a portion of the second conductive layer 240. Next, the conductor 280 is formed in the opening OP1 so that the conductor 280 may be in contact with the second conductive layer 240. At this point, the manufacture of the second component 202b is complete.

Next, referring to FIG. 2C, a third component 202c is formed. Specifically, forming the third component 202c may include, for example, the following steps: forming the third dielectric layer 250, wherein the third dielectric layer 250 has the fifth side 251 and the sixth side 252 opposite to the fifth side 251. Next, the patterned bottom conductive layer 285 is formed on the sixth side 252, and a patterned third insulating layer IS3 is formed on the bottom conductive layer 285. The bottom conductive layer 285 has openings OP2 and OP3 to expose a portion of the third dielectric layer 250. The third insulating layer IS3 may be disposed in the opening OP3, and has an opening OP4 and an opening OP5. The opening OP4 is disposed corresponding to the opening OP2, and the opening OP4 and the opening OP5 may expose a portion of the bottom conductive layer 285 away from a surface 2851 of the third dielectric layer 250. Next, the patterned third conductive layer 260 is optionally formed in the opening OP4 and the opening OP5, so that the third conductive layer 260 is disposed on the surface 2851 of the bottom conductive layer 285 in the portion exposed by the opening OP4 and the opening OP5. In particular, the bottom conductive layer 285 may be disposed between the third dielectric layer 250 and the third conductive layer 260. The third conductive layer 260 may be directly in contact with the bottom conductive layer 285 to prevent the bottom conductive layer 285 from being oxidized. The third conductive layer 260 has the opening 265 to communicate with the opening OP2. At this point, the manufacture of the third component 202c is complete.

Next, referring to FIG. 2D, the first component 202a is bonded to the second component 202b so that the third side 231 of the second dielectric layer 230 in the second component 202b may face the second side 212 of the first dielectric layer 210 in the first component 202a, and the third side 231 may be combined with the second side 212. Next, the fourth dielectric layer 290 is formed on the surface of the second insulating layer IS2 away from the second conductive layer 240, so that the fourth dielectric layer 290 may cover the conductor 280 and the second insulating layer IS2. In the present embodiment, the third side 231 may be directly adhered to the second side 212 by, e.g., a colloid (not shown) via, e.g., a thermal compression process, but the disclosure is not limited thereto. In the present embodiment, a total thickness T1 of the first dielectric layer 210 and the second dielectric layer 230 may be, for example, less than half of a wavelength W2 of the electromagnetic wave emitted by the electronic device 20 and greater than 100 micrometers (μm), that is, 100 μm<T1<½×W2, but the disclosure is not limited thereto. In particular, the total thickness T1 is, for example, the thickness of the first dielectric layer 210 and the second dielectric layer 230 measured along the normal direction Y of the electronic device 20.

In some embodiments, the third side 231 may be indirectly bonded to the second side 212 by, e.g., a spacer (not shown) via, e.g., a one-drop filling (ODF) process. At this point, there may be a gap (not shown) between the second side 212, the third side 231, and the spacer. In particular, the gap may be an air gap or a vacuum gap, and may also be filled with solid material (e.g., colloid or adhesive sheet) or liquid (e.g., water), but the disclosure is not limited thereto. The thickness of the gap may be, for example, less than a quarter of the wavelength W2 of the electromagnetic wave emitted by the electronic device 20, that is, the thickness of the gap<¼×W2, but the disclosure is not limited thereto.

Next, referring to FIG. 2E, the third component 202c is bonded to the fourth dielectric layer 290 so that the third dielectric layer 250 in the third component 202c may be bonded to the fourth dielectric layer 290, and the fifth side 251 of the third dielectric layer 250 may face the fourth side 232 of the second dielectric layer 230. Next, the through hole 254 is formed in the third dielectric layer 250 and the fourth dielectric layer 290, so that the through hole 254 may communicate with the opening OP2 and the opening 265 and expose the conductor 280. In the present embodiment, the forming method of the through hole 254 may include, for example, laser drilling, mechanical drilling, or chemical etching, but the disclosure is not limited thereto. In the present embodiment, the total thickness of the third dielectric layer 250 and the fourth dielectric layer 290 is T2, and the ratio of the total thickness T1 to the total thickness T2 may be, for example, between 2 and 20, that is, 2≤T1/T2≤20, but the disclosure is not limited thereto. In particular, the total thickness T2 is, for example, the thickness of the third dielectric layer 250 and the fourth dielectric layer 290 measured along the normal direction Y of the electronic device 20.

Next, referring to FIG. 2F, the fourth conductive layers 270 and 271 and a solder ball 275 are formed on the top surface 261 of the third conductive layer 260 away from the third dielectric layer 250, and the fourth conductive layers 270 and 271 are formed in the opening OP2, the opening 265, and the through hole 254, so that the fourth conductive layers 270 and 271 may be electrically connected to the conductor 280, and the fourth conductive layers 270 and 271 may be electrically connected to the second conductive layer 240 via the conductor 280. The fourth conductive layers 270 and 271 may be directly in contact with the top surface 261 of the third conductive layer 260. In the present embodiment, the forming method of the fourth conductive layers 270 and 271 may include, for example, tin spraying, electroplating, sputtering, or screen printing, but the disclosure is not limited thereto. Next, the chip 300 is disposed on the top surface 261 of the third conductive layer 260. The chip 300 has a pad 310, and the chip 300 may be electrically connected to the third conductive layer 260 via the pad 310 and the solder ball 275. In some embodiments, the chip 300 may be an IF circuit, an RF circuit, or an integrated circuit of the IF circuit and the RF circuit in the phased array antenna of FIG. 1.

In the present embodiment, via the disposition of the third conductive layer 260, the fourth conductive layers 270 and 271 may be readily attached to the top surface 261 of the third conductive layer 260 and formed into a spherical shape during manufacture. Therefore, the fourth conductive layers 270 and 271 may be limited within the range of the top surface 261 to alleviate the issue that the fourth conductive layers 270 and 271 overflow beyond the range of the top surface 261. In some embodiments, one of the third conductive layer and the fourth conductive layer may be omitted. When the third conductive layer is omitted, the fourth conductive layers 270 and 271 may be formed on the top surface of the other conductive layer. At this time, the other conductive layer may also be used to limit the range of the fourth conductive layers 270 and 271 to alleviate the issue that the fourth conductive layers 270 and 271 overflow beyond the range.

In the present embodiment, via the disposition of at least two dielectric layers (i.e., the first dielectric layer 210 and the second dielectric layer 230), and the manner in which the first conductive layer 220a and the second conductive layer 240 are disposed on different dielectric layers respectively, the first conductive layer 220a and the second conductive layer 240 do not need to be disposed in the same dielectric layer, so as to alleviate the issue that the first conductive layer 220a and the second conductive layer 240 are damaged during manufacture. Moreover, by adjusting the thickness of the dielectric layer (i.e., the first dielectric layer 210 and the second dielectric layer 230) between the two metal plates (i.e., the first conductive layer 220a and the second conductive layer 240), the radiated electromagnetic wave energy may be increased. At this point, the manufacture of the electronic device 20 of the present embodiment is complete.

Other embodiments are listed below for description. It must be noted here that the following embodiments adopt the reference numerals and part of the content of the above embodiments, wherein the same reference numerals are used to represent the same or similar elements, and the description of the same technical content is omitted. For the description of the omitted parts, reference may be made to the above embodiments, which is not repeated in the following embodiments.

Figure 4:
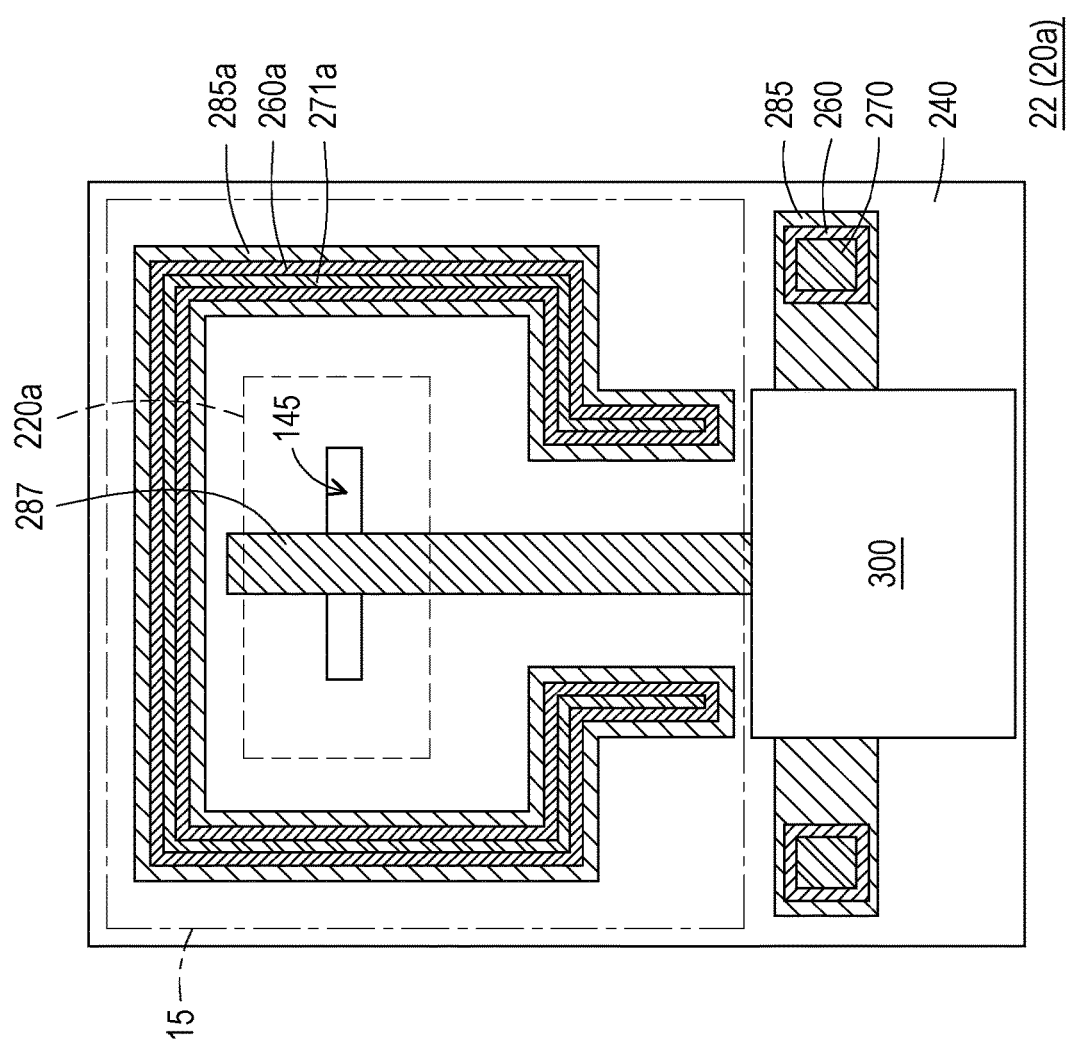
FIG. 4 is a top view of an electronic device of another embodiment of the disclosure.

FIG. 4 is a top view of an electronic device of another embodiment of the disclosure. Please refer to FIG. 3 and FIG. 4 at the same time. An electronic device 20a of the present embodiment is substantially similar to the electronic device 20 of FIG. 3. Therefore, the same and similar members in the two embodiments are not repeated herein. The electronic device 20a of the present embodiment is different from the electronic device 20 in that, in the antenna element 15 of the electronic device 20a of the present embodiment, a fourth conductive layer 271a, a third conductive layer 260a, and a bottom conductive layer 285a are respectively continuous and uninterrupted patterns surrounding the slot 145 together. In addition, the shape of the fourth conductive layer 271a may correspond to the shape of the third conductive layer 260a, and the shape of the third conductive layer 260a may also correspond to the shape of the bottom conductive layer 285a.

FIG. 5A to FIG. 5D are schematic partial top views of conductive structures of a plurality of embodiments of the disclosure. Please refer to FIG. 3 and FIG. 5A to FIG. 5D at the same time, conductive structures 24a, 24b, 24c, and 24d of the present embodiment are substantially similar to the conductive structure 24 of FIG. 3, and therefore the same and similar members in the two embodiments are not repeated herein. The conductive structures 24a, 24b, 24c, and 24d of the present embodiment are different from the conductive structure 24 in that, in the conductive structures 24a, 24b, 24c, and 24d of the present embodiment, the shape of the fourth conductive layer 270 and the shape of the fourth conductive layer 271 may be a closed figure or a partially closed figure other than a circle, so that the fourth conductive layers 270 and 271 may be limited within the range of the shape of the third conductive layer 260 or within the range of the shape of the bottom conductive layer 285 during manufacture.

Figure 5B:
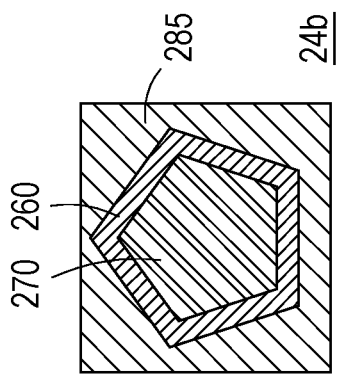
FIG. 5A to FIG. 5D are schematic partial top views of conductive structures of a plurality of embodiments of the disclosure.
Figure 5D:
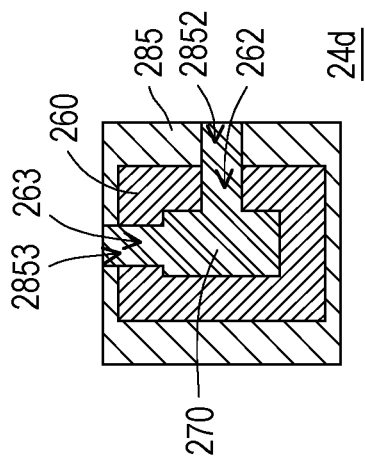
Figure 5A:
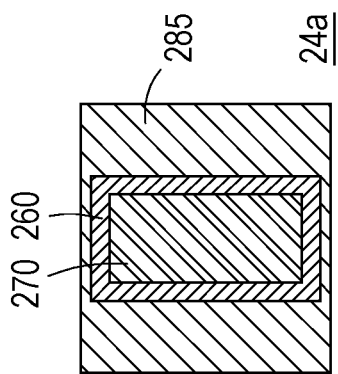

Specifically, referring to FIG. 5A, the shape of the third conductive layer 260 in the conductive structure 24a is a closed square, and the shape of the fourth conductive layer 270 in the conductive structure 24a is also a closed square correspondingly.

Referring to FIG. 5B, the shape of the third conductive layer 260 in the conductive structure 24b is a closed pentagon, and the shape of the fourth conductive layer 270 in the conductive structure 24b is also a closed pentagon correspondingly.

Figure 5C:
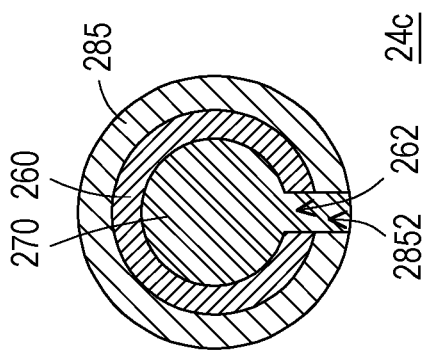

Referring to FIG. 5C, the shape of the bottom conductive layer 285 is a partially closed circle and has a notch 2852. The shape of the third conductive layer 260 in the conductive structure 24c is a partially closed circle and has a notch 262, and the notch 262 may be connected to the notch 2852. The shape of the fourth conductive layer 271 in the conductive structure 24c is a partially closed circle and extended into the notch 262 and the notch 2852.

Referring to FIG. 5D, the shape of the bottom conductive layer 285 is a partially closed square and has the notch 2852 and a notch 2853. The shape of the third conductive layer 260 in the conductive structure 24c is a partially closed square and has the notch 262 and a notch 263, wherein the notch 262 may be connected to the notch 2852, and the notch 263 may be connected to the notch 2853. The shape of the fourth conductive layer 271 in the conductive structure 24c is a partially closed square and extended into the notch 262, the notch 263, the notch 2852, and the notch 2853.

In the present embodiment, although the shape of the third conductive layer 260 may be a circle, a square, or a pentagon, and the shape of the fourth conductive layer 270 and the shape of the fourth conductive layer 270 may be a circle, a square, or a pentagon, the disclosure does not limit the shape of the third conductive layer 260, the shape of the fourth conductive layer 270, and the shape of the fourth conductive layer 270, as long as the fourth conductive layer 270 and the fourth conductive layer 271 may be limited within the range of the shape of the third conductive layer 260 or within the range of the shape of the bottom conductive layer 285 during manufacture.

Based on the above, in the electronic device of an embodiment of the disclosure, via the disposition of at least two dielectric layers (i.e., the first dielectric layer and the second dielectric layer), and the manner in which the first conductive layer and the second conductive layer are disposed on different dielectric layers respectively, the first conductive layer and the second conductive layer do not need to be disposed in the same dielectric layer, so as to alleviate the issue that the first conductive layer and the second conductive layer are damaged during manufacture. In the present embodiment, since the loss tangent Df of at least one of the first dielectric layer and the second dielectric layer is less than or equal to 0.1 and greater than 0 (i.e., 0<Df≤0.1), the loss of the electromagnetic wave in the first dielectric layer and the second dielectric layer may be reduced, and thus the emission efficiency of the electromagnetic wave may be improved. In the present embodiment, since the shape of the third conductive layer (or the shape of the bottom conductive layer) may enclose the shape of the fourth conductive layers, the fourth conductive layers may be limited within the range of the shape of the third conductive layer (or within the range of the shape of the bottom conductive layer) during manufacture, and therefore the issue that the fourth conductive layers overflow beyond the range of the shape of the third conductive layer (or the range of the shape of the bottom conductive layer) during manufacture may be alleviated.

Lastly, it should be noted that the above embodiments are used to describe the technical solution of the disclosure instead of limiting it. Although the disclosure has been described in detail with reference to each embodiment above, those having ordinary skill in the art should understand that the technical solution recited in each embodiment above may still be modified, or some or all of the technical features thereof may be equivalently replaced. These modifications or replacements do not make the essence of the corresponding technical solutions depart from the scope of the technical solution of each embodiment of the disclosure.

What is claimed is:

1. An electronic device, comprising a plurality of units, wherein each of the plurality of units comprises:
    an integrated substrate, wherein the integrated substrate comprises:
        a first dielectric layer having a first side and a second side opposite to the first side;
        a first conductive layer disposed on the first side;
        a second dielectric layer having a third side facing the second side and a fourth side opposite to the third side; and
        a second conductive layer disposed on the fourth side,
    wherein a loss tangent of at least one of the first dielectric layer and the second dielectric layer is less than or equal to 0.1 and greater than 0,
    wherein a total thickness of the first dielectric layer and the second dielectric layer is less than half of a wavelength of an electromagnetic wave emitted by the electronic device and greater than 100 micrometers.

2. The electronic device of claim 1, wherein there is an air gap between the second side and the third side.

3. The electronic device of claim 2, wherein a thickness of the air gap is less than a quarter of a wavelength of an electromagnetic wave emitted by the electronic device.

4. The electronic device of claim 1, wherein the third side is adhered to the second side via a colloid.

5. An electronic device, comprising a plurality of units, wherein one of the plurality of units comprises a plurality of conductive structures, and each of the plurality of conductive structures comprises:
    a dielectric layer;
    a through hole disposed in the dielectric layer;
    a conductive layer disposed on the dielectric layer;
    an opening disposed in the conductive layer;
    another conductive layer disposed on the conductive layer; and
    a chip disposed on the top surface of the conductive layer and electrically connected to the conductive layer;
    wherein the another conductive layer is directly in contact with a top surface of the conductive layer and passes through the opening.

6. The electronic device of claim 5, wherein each of the plurality of conductive structures further comprises:
    a bottom conductive layer disposed between the dielectric layer and the conductive layer, wherein the conductive layer is directly in contact with the bottom conductive layer.

7. The electronic device of claim 5, wherein each of the plurality of conductive structures further comprises:
    another dielectric layer; and
    a conductor disposed on the another dielectric layer,
    wherein the another dielectric layer is combined with the dielectric layer, and the another conductive layer is electrically connected to the conductor.

8. The electronic device of claim 5, wherein in a normal direction of the electronic device, a shape of the conductive layer corresponds to a shape of the another conductive layer.

9. The electronic device of claim 5, further comprising:
    a plurality of units, wherein each of the plurality of units comprises:
        an integrated substrate, wherein the integrated substrate comprises:
            a first dielectric layer having a first side and a second side opposite to the first side;
            a first conductive layer disposed on the first side;
            a second dielectric layer having a third side facing the second side and a fourth side opposite to the third side; and
            a second conductive layer disposed on the fourth side,
        wherein a loss tangent of at least one of the first dielectric layer and the second dielectric layer is less than or equal to 0.1 and greater than 0;
    wherein in a normal direction of the electronic device, the plurality of conductive structures surround one of the plurality of units.

10. The electronic device of claim 9, wherein the another conductive layer is electrically connected to the second conductive layer.

11. The electronic device of claim 9, wherein a total thickness of the first dielectric layer and the second dielectric layer is T1, a total thickness of the dielectric layer and the another dielectric layer is T2, and a ratio of T1 to T2 is between 2 and 20.

12. A manufacturing method of an electronic device, comprising:
    forming a first component, wherein the first component comprises a first dielectric layer and a first conductive layer, the first dielectric layer has a first side and a second side opposite to the first side, and the first conductive layer is disposed on the first side;
    forming a second component, wherein the first component comprises a second dielectric layer and a second conductive layer, the second dielectric layer has a third side facing the second side and a fourth side opposite to the third side, and the second conductive layer is disposed on the fourth side; and
    bonding the first component to the second component to form an integrated substrate,
    wherein a loss tangent of at least one of the first dielectric layer and the second dielectric layer is less than or equal to 0.1 and greater than 0,
    wherein a total thickness of the first dielectric layer and the second dielectric layer is less than half of a wavelength of an electromagnetic wave emitted by the electronic device and greater than 100 micrometers.

13. The manufacturing method of the electronic device of claim 12, further comprising:

forming a third component, wherein the third component comprises a third dielectric layer, a third conductive layer, and an opening, the third conductive layer is disposed on the third dielectric layer, and the opening is disposed in the third conductive layer;

forming a through hole in the third dielectric layer; and forming a fourth conductive layer on the third conductive layer to form a conductive structure, wherein the fourth conductive layer is directly in contact with a top surface of the third conductive layer and passes through the opening.

14. The manufacturing method of the electronic device of claim 13, further comprising:

forming a bottom conductive layer between the third dielectric layer and the third conductive layer, wherein the third conductive layer is directly in contact with the bottom conductive layer.

15. The manufacturing method of the electronic device of claim 13, further comprising:

forming a conductor on the second conductive layer;

forming a fourth dielectric layer on the conductor; and bonding the third component to the fourth dielectric layer so that the fourth dielectric layer is bonded to the third dielectric layer and the fourth conductive layer is electrically connected to the conductor.

16. The manufacturing method of the electronic device of claim 13, further comprising:

disposing a chip on the top surface of the third conductive layer, so that the chip is electrically connected to the third conductive layer.

* * * * *